US008130468B2

(12) United States Patent
Albrecht et al.

(10) Patent No.: US 8,130,468 B2
(45) Date of Patent: Mar. 6, 2012

(54) SYSTEM AND APPARATUS FOR PATTERNED MEDIA WITH REDUCED MAGNETIC TRENCH MATERIAL

(75) Inventors: Thomas Robert Albrecht, San Jose, CA (US); Olav Hellwig, San Jose, CA (US)

(73) Assignee: Hitachi Global Storage Technolgies Netherlands B.V., Amsterdam (NL)

( * ) Notice: Subject to any disclaimer, the term of this patent is extended or adjusted under 35 U.S.C. 154(b) by 1113 days.

(21) Appl. No.: 11/957,981

(22) Filed: Dec. 17, 2007

(65) Prior Publication Data
US 2009/0154017 A1  Jun. 18, 2009

(51) Int. Cl.
*G11B 5/82* (2006.01)
(52) U.S. Cl. ........................................ 360/135
(58) Field of Classification Search ................ 360/135
See application file for complete search history.

(56) References Cited

U.S. PATENT DOCUMENTS

| 5,134,038 | A  | * | 7/1992  | Baseman et al. ............ 428/611 |
| 5,280,401 | A  | * | 1/1994  | Inomata et al. ............ 360/97.01 |
| 6,171,676 | B1 | * | 1/2001  | Mukai et al. ............ 428/836.1 |
| 6,583,957 | B1 | * | 6/2003  | Takeshita et al. ............ 360/135 |
| 6,947,235 | B2 |   | 9/2005  | Albrecht et al. |
| 6,967,815 | B2 |   | 11/2005 | Usa et al. |
| 7,236,325 | B2 |   | 6/2007  | Albrecht et al. |
| 7,635,529 | B2 | * | 12/2009 | Naito et al. ............ 428/848.5 |
| 7,670,696 | B2 | * | 3/2010  | Fullerton et al. ............ 428/834 |
| 7,732,071 | B2 | * | 6/2010  | Fullerton et al. ............ 428/836.1 |
| 7,794,861 | B2 | * | 9/2010  | Saito et al. ............ 428/826 |
| 7,846,565 | B2 | * | 12/2010 | Fullerton et al. ............ 428/834 |
| 2003/0091865 | A1 | * | 5/2003 | Chen et al. ............ 428/693 |
| 2005/0069732 | A1 |   | 3/2005 | Kamata et al. |
| 2005/0157597 | A1 |   | 7/2005 | Sendur et al. |
| 2006/0130317 | A1 |   | 6/2006 | Sewell |
| 2006/0280974 | A1 |   | 12/2006 | Okino et al. |
| 2007/0047140 | A1 |   | 3/2007 | Tabakovic et al. |
| 2008/0037173 | A1 | * | 2/2008 | Saito et al. ............ 360/135 |
| 2008/0049359 | A1 | * | 2/2008 | Tsuchiyama et al. ......... 360/135 |
| 2008/0112079 | A1 | * | 5/2008 | Fullerton et al. ......... 360/123.02 |
| 2008/0274381 | A1 | * | 11/2008 | Fullerton et al. ........... 428/846.3 |

OTHER PUBLICATIONS

Hughes, G. F., Read Channels for Prepatterned Media with Trench Playback, IEEE Transaction son Magnetices, vol. 39, No. 5, Sep. 2003.
Hellwig, O., et al., Separating Dipolar Broadening from the Intrinsic Switching Field Distribution in Perpendicular Patterned Media, Applied Physics Letters, 90, 162516-1, 2007.
Moritz, J., et al., Domain Structure in Magnetic Dots Prepared by Nanoimprint and E-Beam Lithography, Journal of Applied Physics, vol. 91, Issue 10, pp. 7314-7316, May 15, 2002.

* cited by examiner

*Primary Examiner* — Julie Anne Watko

(57) ABSTRACT

A bit patterned magnetic media design for reducing the amount of magnetic material located in the trenches between topographic features is disclosed. An intermediate non-magnetic layer is deposited on the topography prior to depositing the functional magnetic layer on the topographic substrate features. The non-magnetic layer increases the width of the land regions that will ultimately support the functional magnetic layer. The non-magnetic layer also reduces the amount of trench deposition that can occur in the subsequent deposition of the magnetic recording layer. By eliminating most of the magnetic trench material, the amount of magnetic flux and readback interference produced by the trench material is reduced to an acceptable level.

6 Claims, 3 Drawing Sheets

SYSTEM AND APPARATUS FOR PATTERNED MEDIA WITH REDUCED MAGNETIC TRENCH MATERIAL

BACKGROUND OF THE INVENTION

1. Technical Field

The present invention relates in general to patterning magnetic media for hard disk drives and, in particular, to an improved system, method and apparatus for hard disk drive patterned magnetic media having a reduced amount of magnetic trench material.

2. Description of the Related Art

Data access and storage systems generally comprise one or more storage devices that store data on magnetic storage media. For example, a magnetic storage device or hard disk drive (HDD) includes one or more disks and a disk controller to manage operations concerning the disks. The hard disks themselves are usually fabricated from an aluminum alloy, glass or a mixture of glass and ceramic, and are covered with a magnetic media coating that contains the bit pattern.

One common approach to making the bit patterned media (BPM) or discrete track media (DTM) on the disks is to create topographic patterns on the substrate, followed by blanket deposition of the magnetic recording layers. Magnetic material deposited on the tops (or "lands") of topographic features is used for recording, while material deposited in the etched relief areas (or "trenches") is not intended to be used for recording.

However, it has been shown through both modeling and experiments that magnetic material located in the trenches produces significant unwanted magnetic flux, which interferes with the readback signal. The present invention seeks to reduce the amount of magnetic material ending up in the trenches and thereby to reduce readback interference caused by the trench material.

Referring to FIG. 1, a schematic sectional side view of a disk 11 having conventional patterned media formed on a substrate 13 is shown. The media includes a soft underlayer 15, an exchange break layer 17 and non-magnetic pillars 19 or raised track structures having trenches 25 therebetween. A magnetic layer is blanket deposited on the topographically patterned substrate. This deposition forms a magnetic recording layer 21 (i.e., formed as "islands") on the pillars 19, and some magnetic material 23 in the trenches 25 between the pillars 19. The magnetic material 21 deposited on top of the pillars 19 is used for recording, while the trench material 23 generates unwanted magnetic flux that increases the background noise level and interferes with readback operations of the disk drive.

The amount of magnetic material in the trenches can be reduced by depositing the magnetic material at an angle with respect to normal incidence. However, angled deposition does not completely eliminate the trench material due to the complex, three-dimensional shapes of the pillars (particularly for BPM), and the fact that sputter deposition has only limited directionality. Furthermore, angled deposition can result in significant deposits on the sidewalls of the topography, which also has unintended effects on the magnetic properties of the islands or tracks.

An alternative solution to this problem is to "poison" the trench material. Poisoning the trench material is attractive from the point of view of totally eliminating the magnetism of the trench material. However, there are some challenges to successfully implementing such an approach for small feature sizes, including the effects of dimensional distortion of feature shapes due to diffusion processes. Thus, an improved solution for reducing the unwanted effects of having magnetic media located in the trenches between the topographic features of disks would be desirable.

SUMMARY OF THE INVENTION

Embodiments of a system, method and apparatus for reducing the amount of magnetic material located in the trenches between topographic features in bit patterned media are shown. The invention reduces or eliminates the readback interference caused by the trench material. Although the invention described herein may leave a small amount of magnetic material in the trenches, no diffusion is used. Therefore the negative consequences of diffusion are eliminated when scaling down the island size to densities beyond what is currently achieved in conventional perpendicular recording demonstrations.

In one embodiment, an intermediate and significantly thicker non-magnetic layer is deposited on the topography prior to depositing the functional magnetic layer on the topographic substrate features. Thin seed layers, underlayer structures and/or adhesion layers may be deposited directly beneath the magnetic layer, either above or below the intermediate layer. The non-magnetic layer has the effect of increasing the lateral diameter of the land regions that will ultimately support the functional magnetic layer. This also increases the effective area filling factor of magnetic material that contributes to the readback signal. In addition, the non-magnetic layer reduces the amount of trench deposition that can occur in the subsequent deposition of the magnetic recording layer. By eliminating most of the magnetic trench material, the amount of magnetic flux and readback interference produced by the trench material is reduced to an acceptable level.

Even if the non-magnetic material is incidentally deposited on the side walls, it will not cause any undesired effects, such as those experienced with magnetic materials. Overall the degree of sidewall overgrowth effects can be mitigated by varying the deposition angle with respect to the surface normal of the substrate.

The magnetic properties of the recording layers are fairly independent of the non-magnetic interlayer thickness. For example, TaPd alloys or Ta/Pd bilayers may be used for the non-magnetic layer to fulfill this requirement.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the present invention are attained and can be understood in more detail, a more detailed description of the invention may be had by reference to the embodiments that are illustrated in the appended drawings. However, the drawings illustrate only some embodiments of the invention and therefore are not to be considered limiting of its scope as the invention may admit to other equally effective embodiments.

DETAILED DESCRIPTION OF THE INVENTION

Referring to FIGS. 2-5, embodiments of a system, method and apparatus for reducing the amount of magnetic material located in the trenches between topographic features in bit patterned media are shown.

Figure 1:
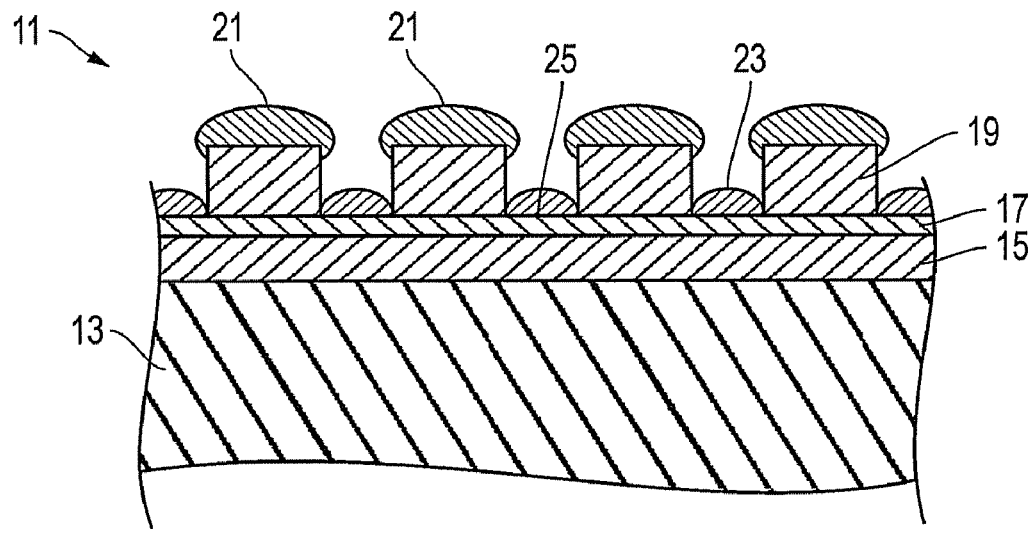
FIG. 1 is a schematic sectional side view of conventional patterned media for a magnetic media disk.
Figure 2:
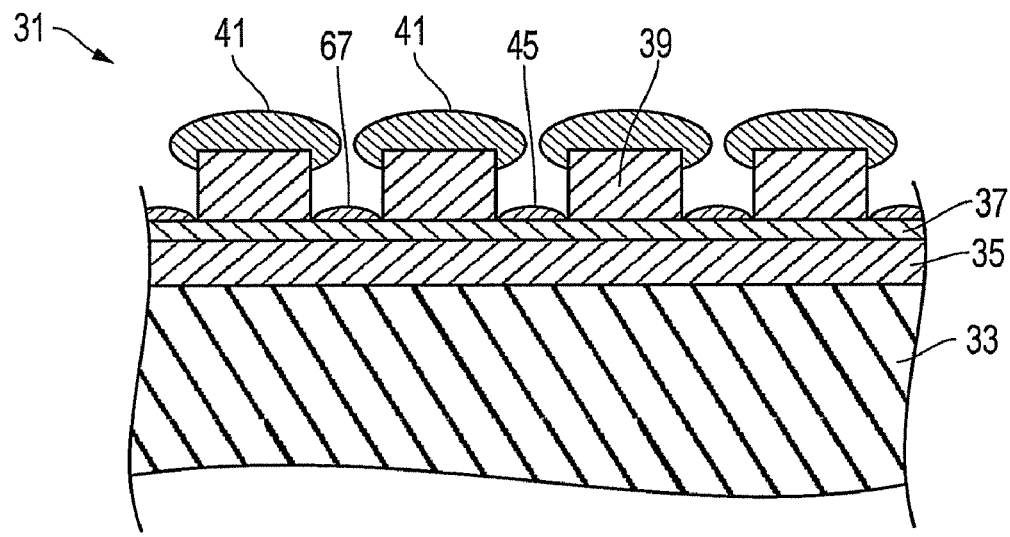
FIG. 2 is a schematic sectional side view of one embodiment of a sub-assembly of patterned media for a magnetic media disk before deposition of the magnetic layer, and is constructed in accordance with the invention.
Figure 3:
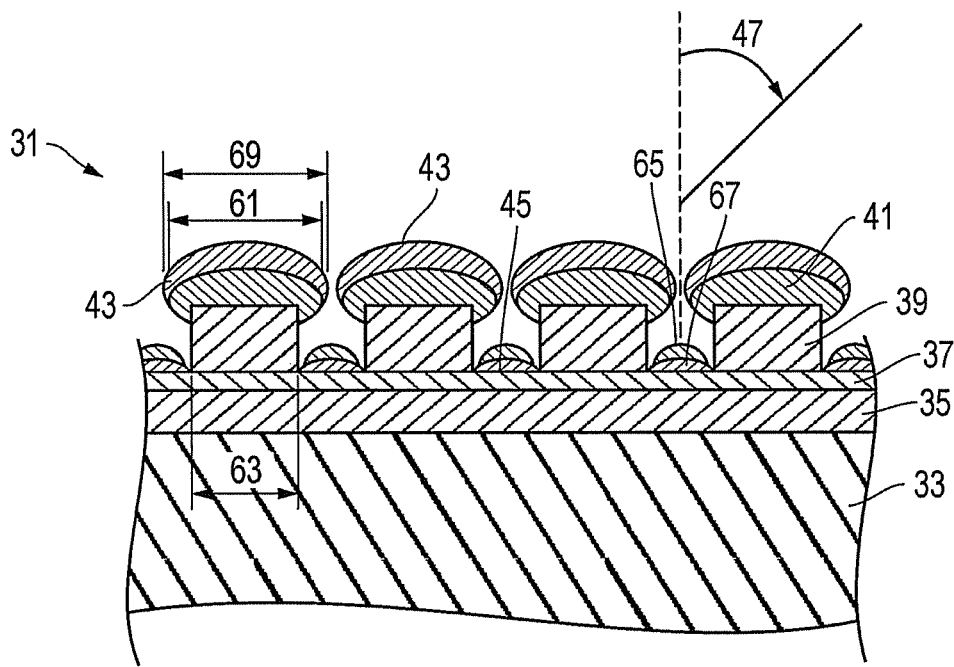
FIG. 3 is a schematic sectional side view of one embodiment of the patterned media of FIG. 2 after deposition of a magnetic recording layer and is constructed in accordance with the invention.

In one embodiment (FIG. 2), the invention comprises a magnetic media disk 31 for a hard disk drive. The disk may include a substrate 33, a soft underlayer 35 on the substrate 33, and an optional exchange break layer 37 on the soft underlayer 35. Topographic formations or islands 39 extend from the substrate 33 and/or layers formed thereon. An intermediate non-magnetic material 41 is deposited on this structure 39, followed by the deposition of a magnetic recording layer 43 (FIG. 3). FIG. 2 schematically illustrates the structure after depositing the intermediate layer 41. FIG. 3 schematically shows the media structure after deposition of the magnetic recording layer 43. This process and configuration reduces the amount of magnetic material deposited in the trenches 45.

The non-magnetic material is deposited under conditions that result in lateral (i.e., left and right in FIGS. 2 and 3) as well as vertical growth of the film. Material extends outward laterally from the tops of the islands 39, which narrows the access aperture for approaching material from any subsequent further deposition of material. These self-shadowing effects prevent a fast coalescence of adjacent islands/pillars and thus prevent any undesired coupling between adjacent islands/pillars. Using an angle of incidence 47 (FIG. 3) other than normal promotes lateral growth of the film and side wall growth, thus increasing the island width and the effective area contributing to the readback signal.

Figure 4:
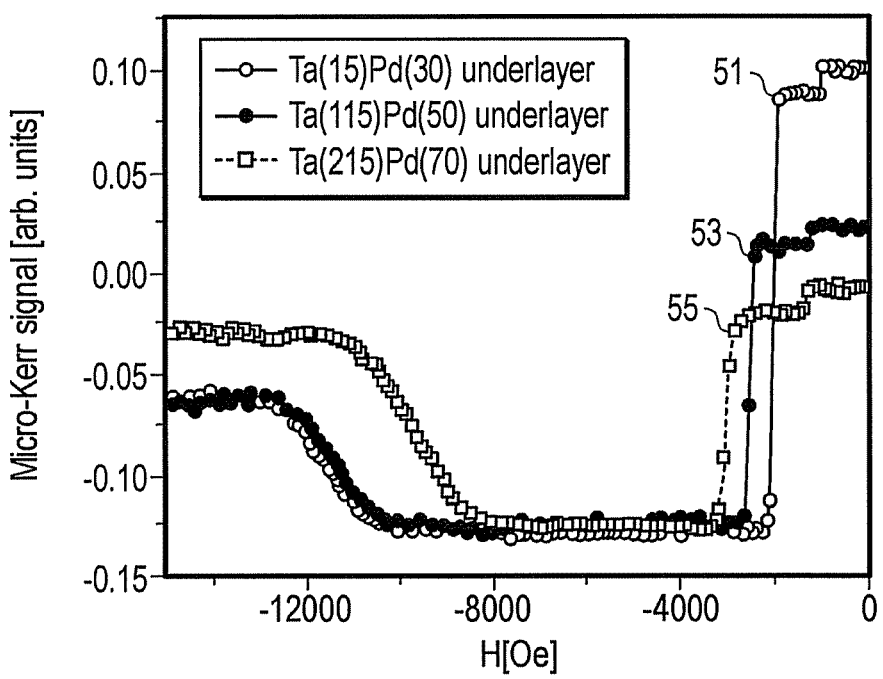
FIG. 4 depicts plots of Micro-Kerr remnant reversal curves for different non-magnetic interlayer thicknesses on patterned media constructed in accordance with the invention.

The magnetic properties of the recording layers are fairly independent of the non-magnetic interlayer thickness. For example, materials such as Ta and Pd may be used to fulfill this requirement as demonstrated in the Micro-Kerr measurements in FIG. 4. FIG. 4 is a plot of Micro-Kerr remnant reversal curves 51, 53, 55 for different non-magnetic interlayers for a Co/Pd multilayer media. In this example the islands are 50 nm in width and formed at a 100 nm pitch. The island switching field is similar in all three cases (i.e., about 11 kOe). However, for an interlayer having a thickness of 28.5 nm, a small shift is observed to lower the reversal fields. The Kerr signal from the trench reversal (at about 2-3 kOe) is reduced with increasing interlayer thickness, which indicates that there is less magnetic trench material for thicker interlayers. Overall, the thickness of the non-magnetic layer should be tuned depending on the lateral periodicity of the pattern and the initial trench width of the pre-patterned substrate. This maximizes the effective area that contributes to the readback signal without causing any inter-island exchange coupling.

Since access to the trenches is reduced by deposition of the intermediate layer, significantly less magnetic material is deposited in the trenches as also confirmed experimentally by the Kerr measurements in FIG. 4. The growth of the intermediate layer effectively "pinches off" the access route for deposition of further material in the trenches. Choosing to deposit the magnetic material at an angle other than normal can further reduce deposition of magnetic trench material. Based on experimental results, reducing the amount of trench material by a factor of two or three may be sufficient to achieve adequate readback signal to noise ratio.

Using magnetic multilayers as magnetic media, one may use different angles for two multilayer materials, which leads to proper multilayer structures on top of the islands. Predominantly, only one material reaches the trenches (i.e., with normal incidence) and the other material reaches the sidewalls (i.e., at an angled incidence). Thus, different material compositions are formed on the sidewalls and trenches which may result in non-magnetic phases in the trenches as well as on the sidewalls.

In addition, subsequent oxidation processes may play a significant role in such configurations. For example, a Pd/Co multilayer may be used with Pd deposited normal to the substrate surface and Co deposited at an angle. This results in a Pd-rich trench phase (non-magnetic) and a Co-rich side wall phase. However, the Co on the sidewalls does not form a continuous film and thus oxidizes to non-ferromagnetic Co-oxide clusters after the media is exposed to ambient air. In contrast, the multilayer on top of the islands are protected by a final cap layer, such as a Pd cap having a thickness of 2 nm.

As shown in the drawings, deposition of the intermediate layer causes the lateral dimensions of the lands or islands to grow. Such lateral growth (and additional curvature, which may develop when depositing the interlayer) needs to be taken into account in the magnetic design of the media from a recording system point of view. For example, larger lands or islands increase overall readback flux, which is desirable, but also increases dipole interactions between islands in BPM, which may adversely affect switching field distribution. See, e.g., the publication, *Separating Dipolar Broadening from the Intrinsic Switching Field Distribution in Perpendicular Patterned Media*, O. Hellwig, et al, Appl. Phys. Lett. 90, 162516 (2007). Such effects may need to be countered by reducing the moment or thickness of the magnetic recording layer. For DTM, increased land width may affect the optimal choice for head element widths and off-track and adjacent track erasure effects.

In one embodiment, the invention comprises a magnetic media disk including a substrate, a plurality of topographic features formed on the substrate and defining trenches therebetween, a layer of non-magnetic material formed on the topographic features and on the trenches, and a layer of magnetic material formed on the layer of non-magnetic material on at least the topographic features to define a recording layer.

Referring again to the embodiment of FIGS. 2 and 3, the layer of non-magnetic material is segmented into portions 41 that are located on the topographic features 39, and portions 67 that are located in the trenches 45. In addition, the layer of magnetic material is segmented into magnetic portions 43 on non-magnetic portions 41, and magnetic portions 65 on non-magnetic portions 67. Each of the non-magnetic portions 41 has a width 61 that is greater than a width 63 of the topographic features 39, but narrower than a width 69 of the magnetic portions 43. However, the widths of non-magnetic portions 67 are greater than the widths of magnetic portions 65.

In other embodiments, the topographic features are non-magnetic, and have sidewalls on which some of the non-magnetic material is located. At least portions of the layer of magnetic material also are located on the non-magnetic material formed on the trenches. The substrate has a surface that defines a planar direction, the topographic features extend in a direction that is normal to the planar direction, and the layer of non-magnetic material located on the topographic features extends substantially parallel to the planar direction.

In still another embodiment, a soft underlayer formed on the substrate, an optional exchange break layer formed on the soft underlayer, and the topographic features extend from the exchange break layer such that the trenches also are located on the exchange break layer. The non-magnetic layer may have a thickness of approximately 15 to 30 nm (e.g., 15 to 20 nm in one embodiment), depending on the pattern periodicity. In addition, the non-magnetic layer may comprise a TaPd alloy or Ta/Pd bilayers. The disk may comprise thin seed layers, underlayer structures and/or adhesion layers deposited directly beneath the magnetic layer, either above or below the intermediate layer.

As shown and described herein, the topographic features may comprise islands having a spacing therebetween. The non-magnetic material segments located on the islands have a smaller spacing between them than the spacing between the islands. In another embodiment, an aperture is defined between adjacent islands, one trench is defined in each aperture, and the non-magnetic material reduces the size of each aperture.

Figure 5:
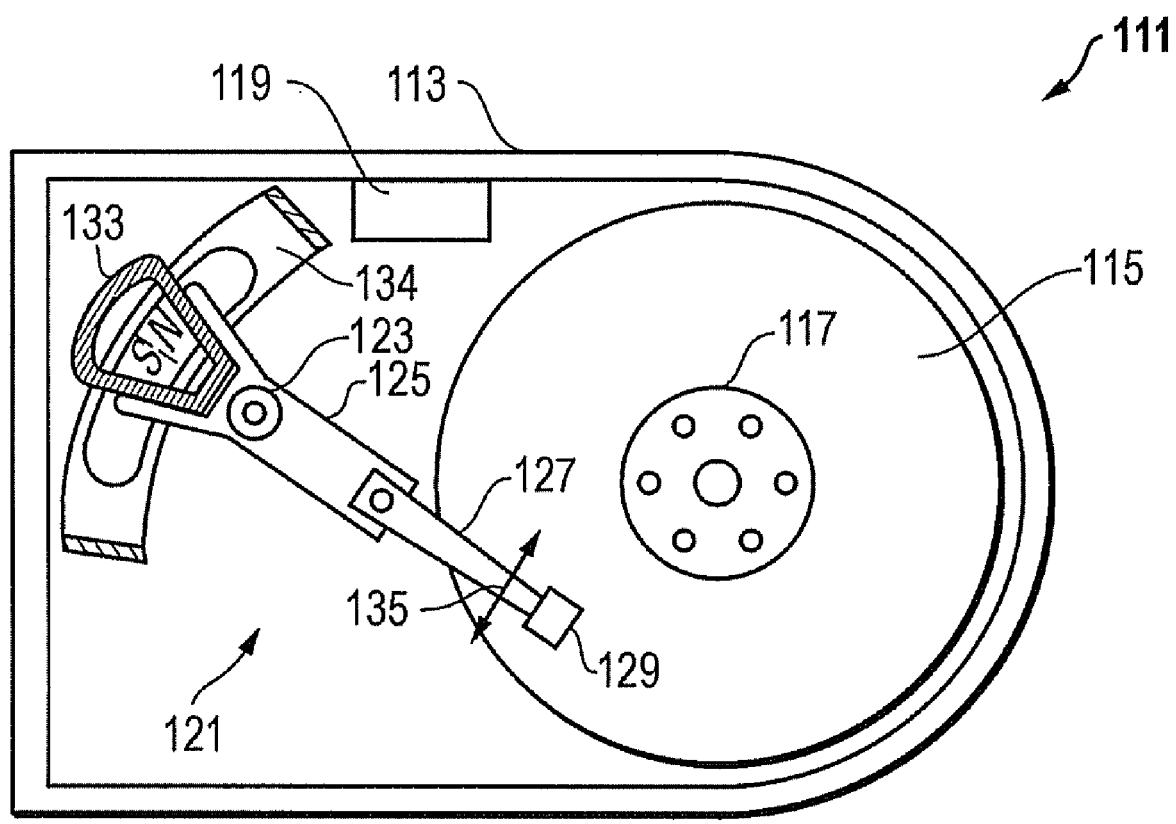
FIG. 5 is a schematic diagram of one embodiment of a disk drive constructed in accordance with the invention.

Referring now to FIG. 5, a schematic drawing of one embodiment of an information storage system comprising a magnetic hard disk file or drive 111 for a computer system is shown. Drive 111 has an outer housing or base 113 containing at least one magnetic disk 115. Disk 115 is rotated by a spindle motor assembly having a central drive hub 117. An actuator 121 comprises one or more parallel actuator arms 125 in the form of a comb that is pivotally mounted to base 113 about a pivot assembly 123. A controller 119 is also mounted to base 113 for selectively moving the comb of arms 125 relative to disk 115.

In the embodiment shown, each arm 125 has extending from it at least one cantilevered load beam and suspension 127. A magnetic read/write transducer or head is mounted on a slider 129 and secured to a flexure that is flexibly mounted to each suspension 127. The read/write heads magnetically read data from and/or magnetically write data to disk 115. The level of integration called the head gimbal assembly is the head and the slider 129, which are mounted on suspension 127. The slider 129 is usually bonded to the end of suspension 127. The head is typically formed from ceramic or intermetallic materials and is pre-loaded against the surface of disk 115 by suspension 127.

Suspensions 127 have a spring-like quality which biases or urges the air bearing surface of the slider 129 against the disk 115 to enable the creation of the air bearing film between the slider 129 and disk surface. A voice coil 133 housed within a voice coil motor magnet assembly 134 is also mounted to arms 125 opposite the head gimbal assemblies. Movement of the actuator 121 (indicated by arrow 135) by controller 119 moves the head gimbal assemblies radially across tracks on the disk 115 until the heads settle on their respective target tracks.

While the invention has been shown or described in only some of its forms, it should be apparent to those skilled in the art that it is not so limited, but is susceptible to various changes without departing from the scope of the invention. For example, the invention also is suitable for magnetic media applications such as magnetic tape.

What is claimed is:

1. A hard disk drive, comprising:
   an enclosure having a magnetic media disk rotatably mounted thereto and an actuator having a head for reading data from and writing data to the magnetic media disk; the magnetic media disk further comprising:
   a substrate;
   a plurality of topographic features formed on the substrate and defining trenches therebetween;
   a layer of non-magnetic material formed on the topographic features;
   a layer of magnetic material formed on the layer of non-magnetic material on at least the topographic features to define a recording layer;
   the layer of non-magnetic material is segmented into portions that are located on respective ones of the topographic features, and each of the portions has a width that is greater than a width of said respective ones of the topographic features; and
   the layer of magnetic material is segmented into portions that are located on respective ones of the portions of the non-magnetic material, and each of the portions of the magnetic material has a width that is greater than the width of said respective ones of the portions of the non-magnetic material.

2. A hard disk drive according to claim 1, wherein the topographic features are non-magnetic and have sidewalls on which some of the non-magnetic material is located;
   at least portions of the layer of magnetic material are also located on non-magnetic material formed on the trenches; and
   the magnetic material in the trenches is oxidized to a non-ferromagnetic material, and the magnetic material on the topographic features is protected by a cap layer to retain magnetic properties.

3. A hard disk drive according to claim 1, wherein the substrate has a surface that defines a planar direction, the topographic features extend in a direction that is normal to the planar direction, and the layer of non-magnetic material located on the topographic features extends substantially parallel to the planar direction; and further comprising
   a soft underlayer formed on the substrate, an exchange break layer formed on the soft underlayer, and the topographic features extend from the exchange break layer such that the trenches also are located on the exchange break layer.

4. A hard disk drive according to claim 1, further comprising at least one additional layer selected from the group consisting of a seed layer, an underlayer structure and an adhesion layer, said at least one additional layer being deposited directly beneath the magnetic layer, and said at least one additional layer being located above or below the non-magnetic layer.

5. A hard disk drive according to claim 1, wherein the topographic features comprise islands having a spacing therebetween, and the non-magnetic material located on the islands have a smaller spacing therebetween than the spacing between the islands.

6. A hard disk drive according to claim 1, wherein an aperture is defined between adjacent ones of the topographic features, one trench is defined in each aperture, and the non-magnetic material reduces a size of each aperture.

* * * * *